United States Patent
Hsu

(10) Patent No.: US 9,029,896 B2
(45) Date of Patent: May 12, 2015

(54) LIGHT-EMITTING DEVICE

(71) Applicant: Epistar Corporation, Hsinchu (TW)

(72) Inventor: Chia-Liang Hsu, Hsinchu (TW)

(73) Assignee: Epistar Corporation, Hsinchu (TW)

(*) Notice: Subject to any disclaimer, the term of this patent is extended or adjusted under 35 U.S.C. 154(b) by 0 days.

(21) Appl. No.: 13/916,805

(22) Filed: Jun. 13, 2013

(65) Prior Publication Data

US 2013/0270599 A1    Oct. 17, 2013

Related U.S. Application Data

(63) Continuation-in-part of application No. 13/174,183, filed on Jun. 30, 2011, now Pat. No. 8,513,699.

(51) Int. Cl.
| | | |
|---|---|---|
| H01L 33/62 | (2010.01) | |
| H01L 23/00 | (2006.01) | |
| H01L 33/38 | (2010.01) | |
| H01L 33/20 | (2010.01) | |
| H01L 33/32 | (2010.01) | |
| H01L 33/48 | (2010.01) | |

(52) U.S. Cl.
CPC .......... *H01L 33/62* (2013.01); *H01L 24/24* (2013.01); *H01L 24/82* (2013.01); *H01L 33/20* (2013.01); *H01L 33/32* (2013.01); *H01L 33/385* (2013.01); *H01L 33/486* (2013.01); *H01L 2924/12041* (2013.01)

(58) Field of Classification Search
CPC ....... H01L 33/20; H01L 33/62; H01L 33/385; H01L 33/38
USPC .................. 257/98, 99, 79, 88, 103, E27.121, 257/E33.066, E33.013
See application file for complete search history.

(56) References Cited

U.S. PATENT DOCUMENTS

| | | | |
|---|---|---|---|
| 7,626,208 B2 * | 12/2009 | Yang et al. ...................... | 257/88 |
| 2003/0010986 A1 * | 1/2003 | Lin et al. .......................... | 257/79 |
| 2004/0188696 A1 * | 9/2004 | Hsing Chen et al. ........... | 257/99 |
| 2006/0011935 A1 | 1/2006 | Krames et al. | |
| 2008/0251808 A1 * | 10/2008 | Kususe et al. ................... | 257/98 |

* cited by examiner

*Primary Examiner* — Whitney T Moore
(74) *Attorney, Agent, or Firm* — Muncy, Geissler, Olds & Lowe, P.C.

(57) ABSTRACT

The present application is related to a light-emitting device. The present application illustrates a vertical light-emitting device in one embodiment, comprising: a conductive substrate includes a through-hole, a patterned semiconductor structure disposed on a first surface of the substrate, a first bonding pad and a second bonding pad disposed on a second surface of the substrate, a conductive line passing through the through-hole connecting electrically the semiconductor structure layer, and an insulation layer on at least one sidewall of the through-hole insulates the conductive line form the substrate.

20 Claims, 12 Drawing Sheets

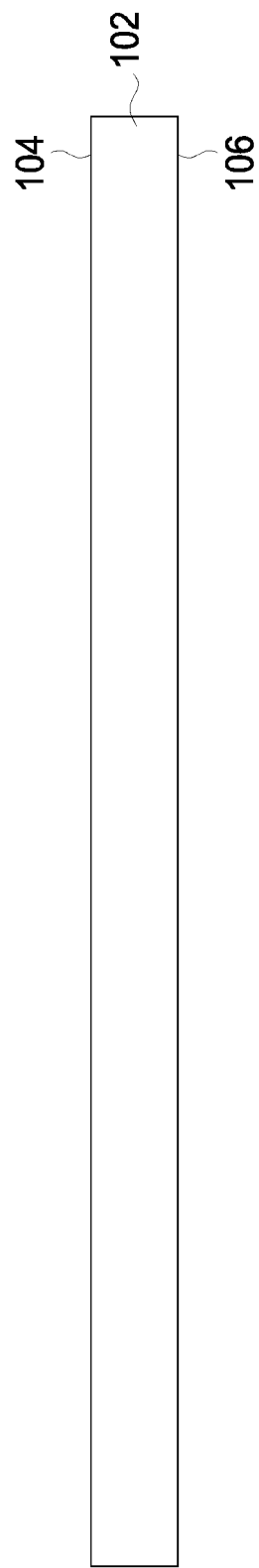
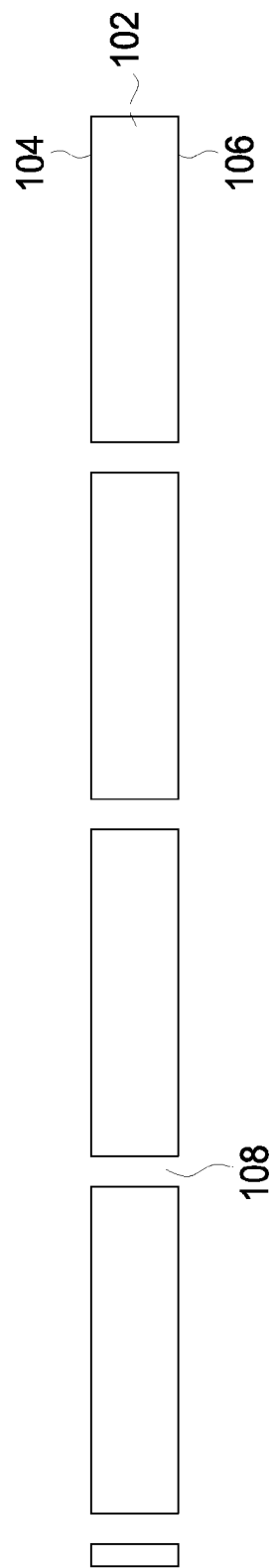
FIG.1A
FIG.1B

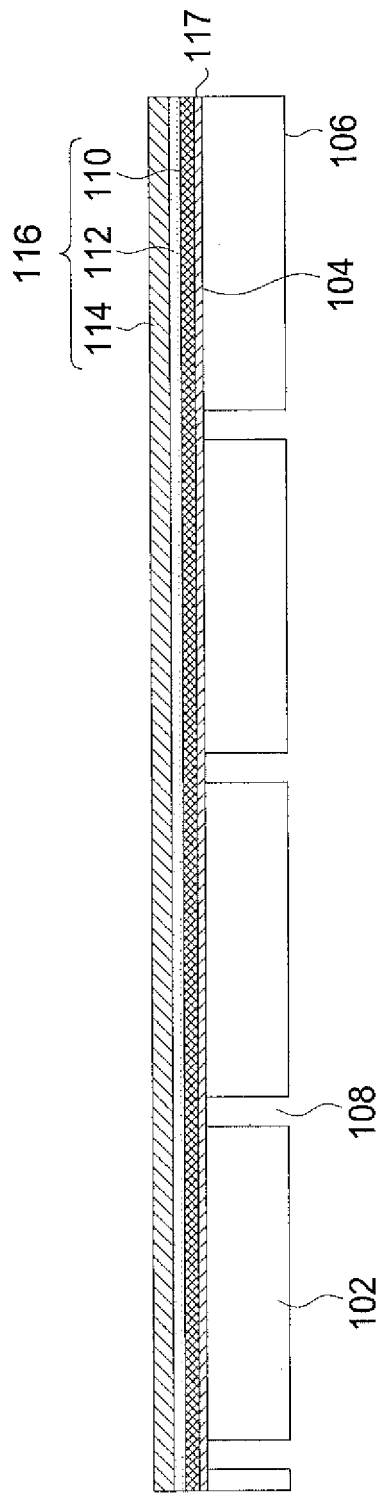
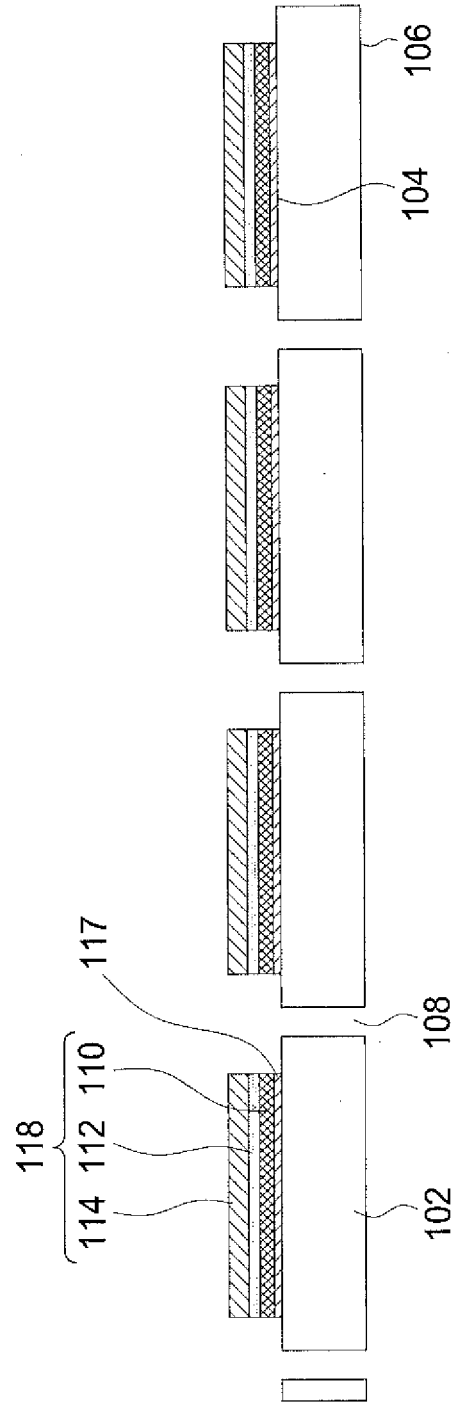

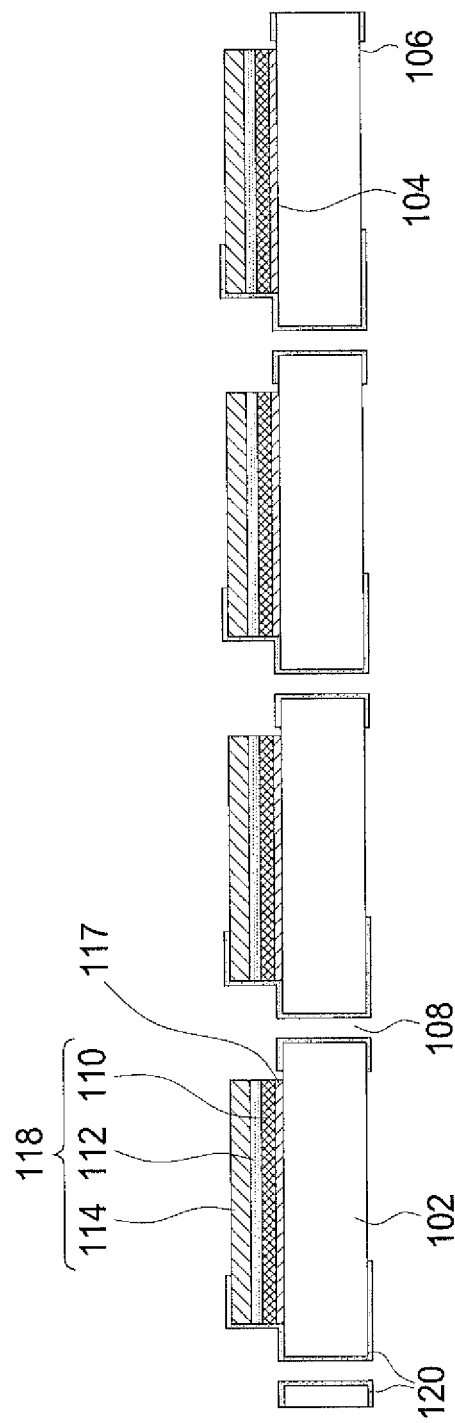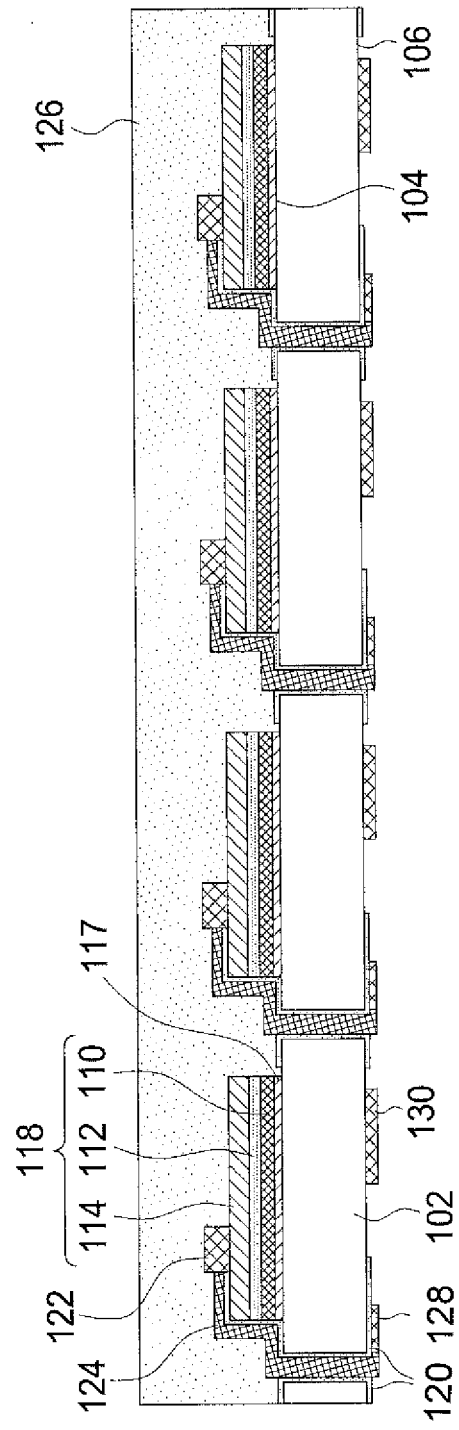

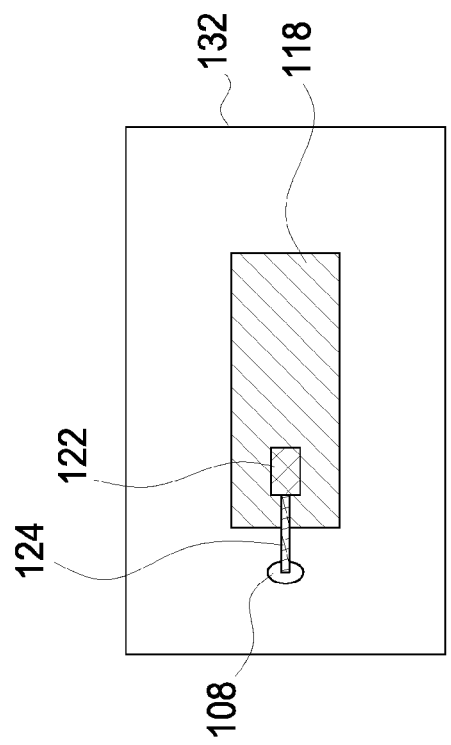
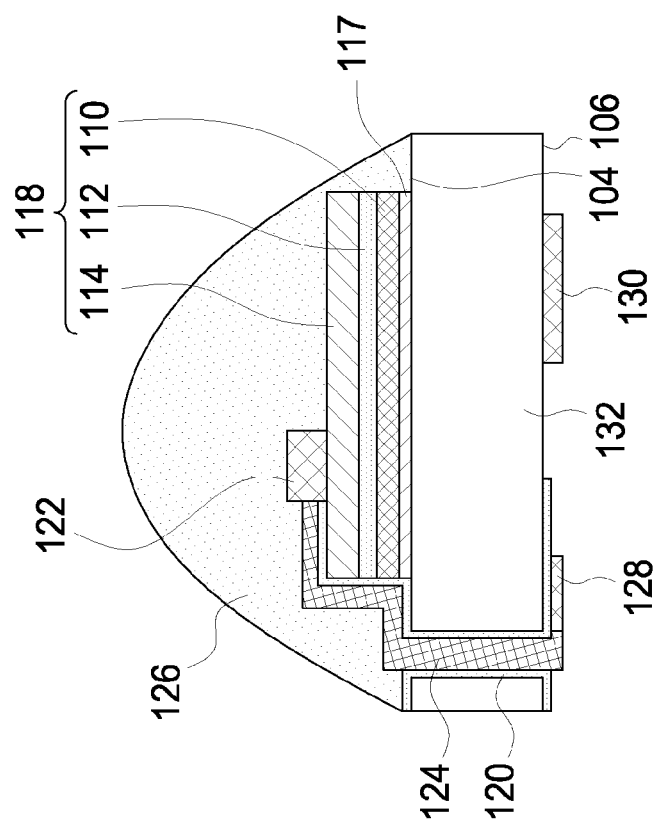
FIG.1H
FIG.1G

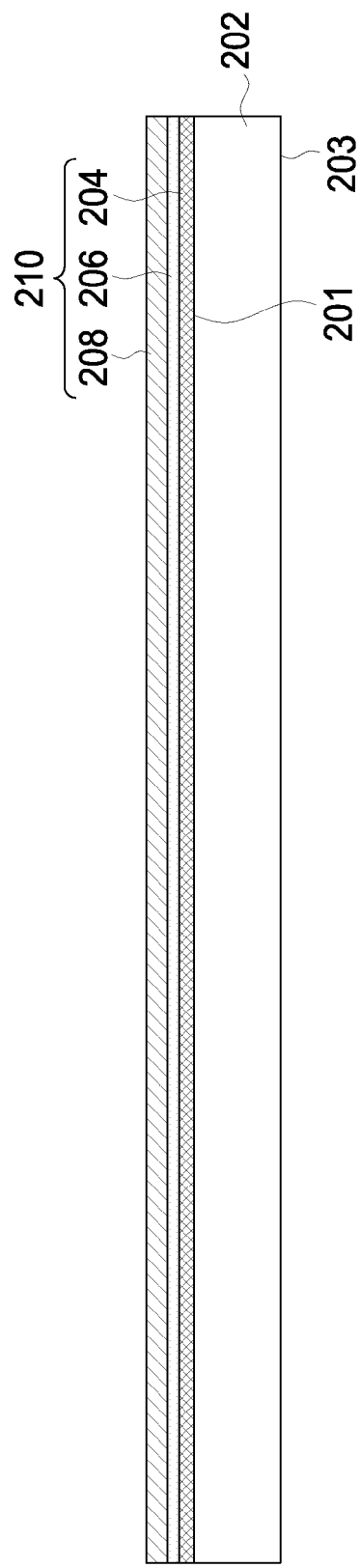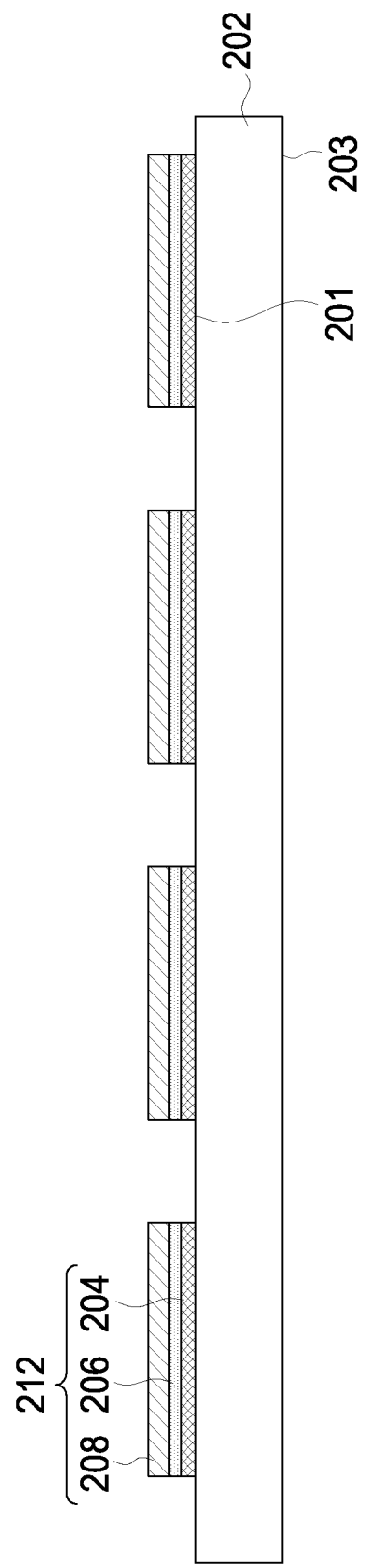

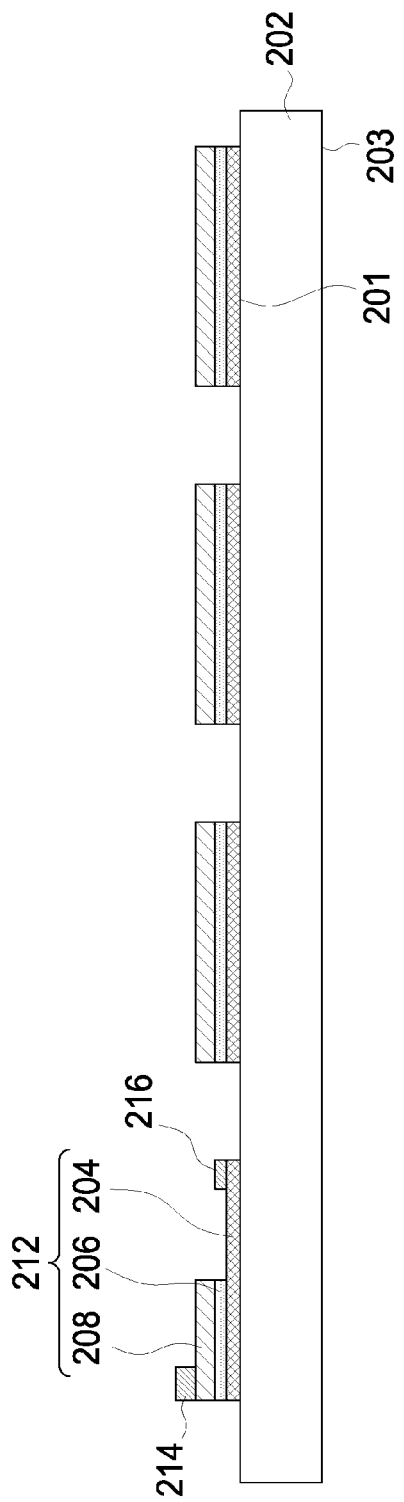
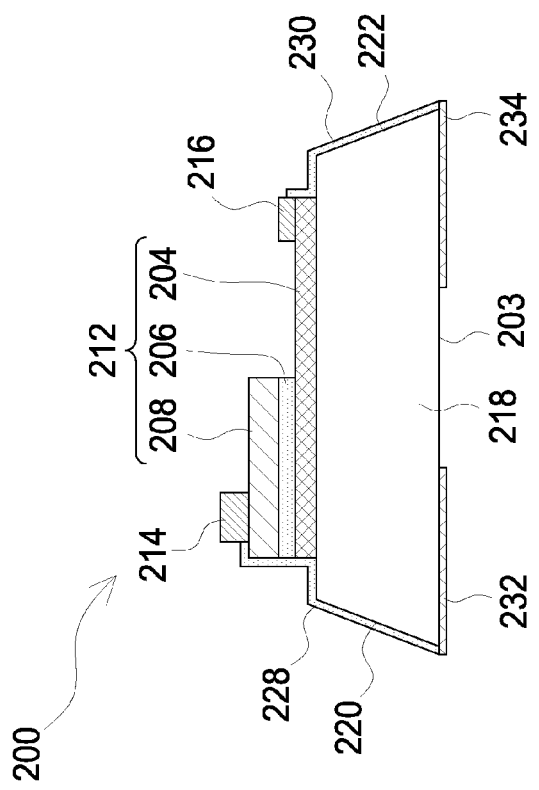
FIG.2C
FIG.2D

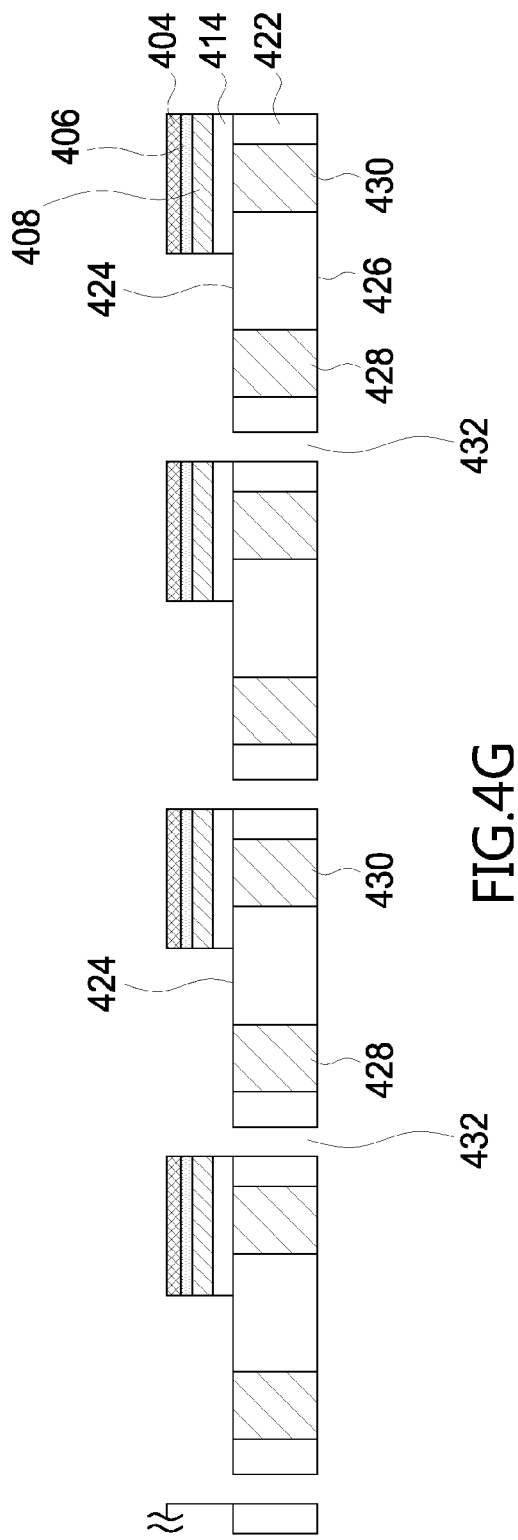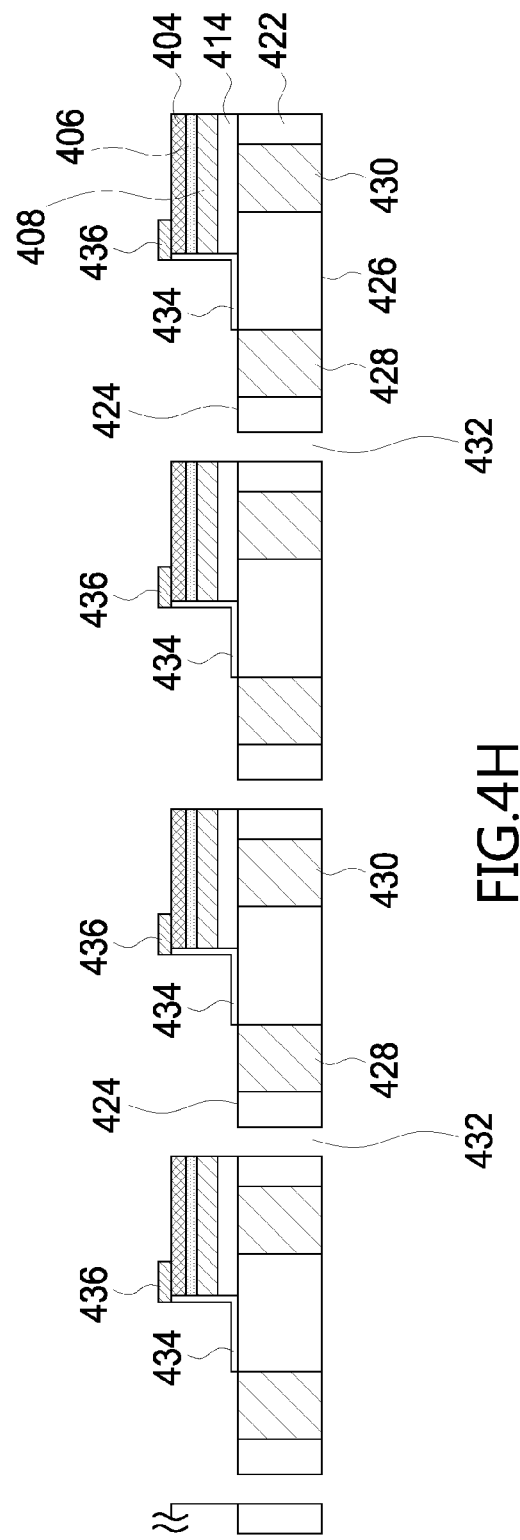

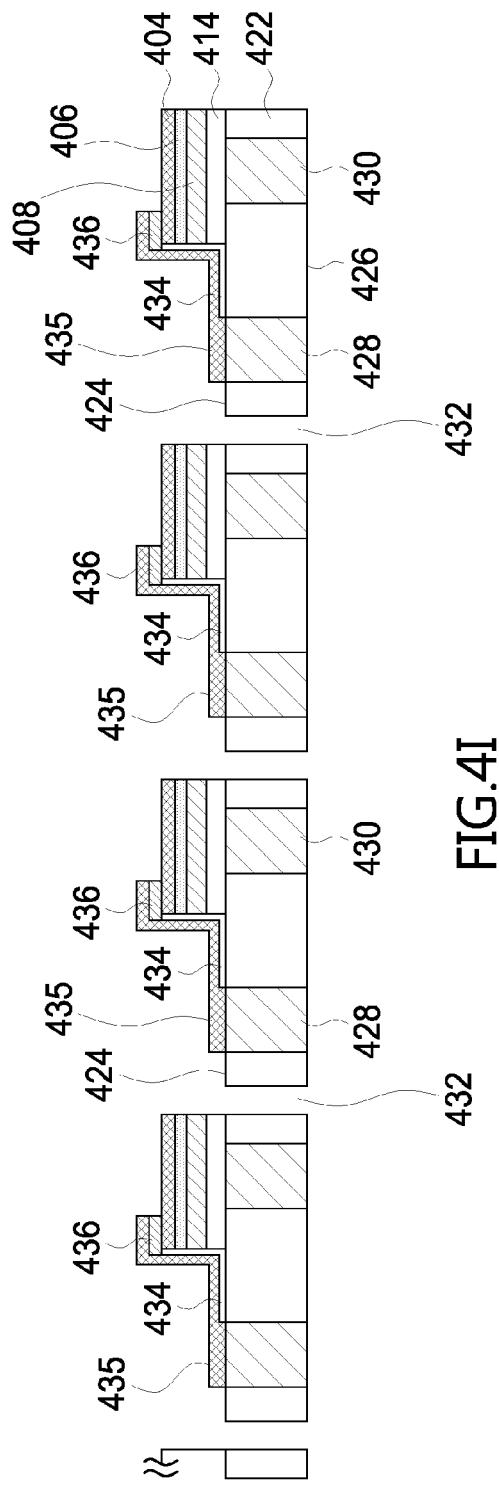
FIG.4I
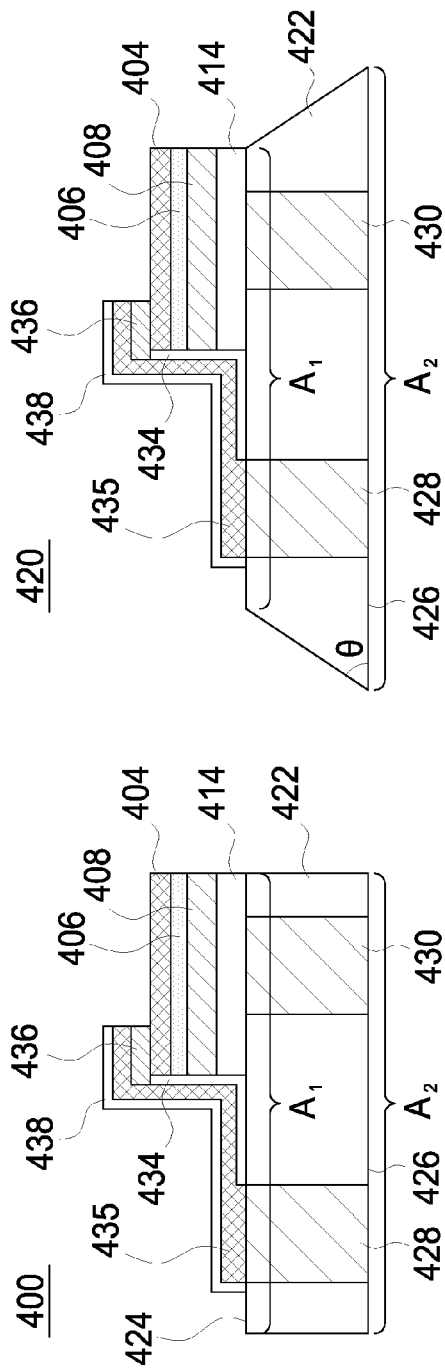
FIG.4J
FIG.4K

LIGHT-EMITTING DEVICE

CROSS REFERENCE TO RELATED APPLICATIONS

This application is a continuation-in-part of application Ser. No. 13/174,183, field on Jun. 30, 2011, which is a continuation of application Ser. No. 12/318,552, filed on Dec. 31, 2008, now U.S. Pat. No. 7,973,331. This application is entirely incorporated herein by reference and assigned to the assignee herein.

TECHNICAL FIELD

The present application generally relates to a light-emitting device, and more particularly to a light-emitting diode.

BACKGROUND

Light-emitting diodes (LEDs) having advantages of low electricity consumption and high-speed power on-off response are versatile for different applications. Following the high-end cellular phone adopting LEDs as the back-lighting source, more and more electronic products intent to use LEDs. Since the electronic products require light, thin, short, and small, how to reduce the LEDs package space and cost is a key issue.

LEDs with transparent substrate can be classified as a face up type and a flip chip type. The LEDs mentioned above may be mounted with the substrate side down onto a submount via a solder bump or glue material to form a light-emitting apparatus. Besides, the submount further comprises at least one circuit layout electrically connected to the electrode of the LEDs via an electrical conducting structure, such as a metal wire. Such LEDs package has difficulty to satisfy the light, thin, short, and small requirements because so many kinds of package materials stack together. In sum, a reduced package size of the LEDs and simpler package process are needed.

SUMMARY

A wafer level chip scale package (WLCSP) is provided to achieve the purpose of a smaller size of LEDs package and a simpler package process, and increase the LEDs light extraction efficiency in the same time.

In one embodiment of the present application, a light-emitting device comprises a conductive substrate with a through-hole, a patterned semiconductor structure which includes a first conductive type semiconductor layer, an active layer and a second conductive type semiconductor layer on a first surface of the substrate, a first bonding pad and a second bonding pad on a second surface of the substrate, a conductive line through the through-hole connecting electrically the first conductive type semiconductor with the first bonding pad, and an isolating layer on at least the sidewall of the through-hole isolates the conductive line from the substrate.

In another embodiment of the present application, a light-emitting device comprises a substrate with at least a tilted sidewall, a patterned semiconductor structure which includes a first conductive type semiconductor layer, an active layer and a second conductive type semiconductor layer on a first surface of the substrate, and a first conductive line on at least the tilted sidewall of the substrate connects electrically the first conductive type semiconductor layer of the patterned semiconductor structure.

In another embodiment of the present application, a light-emitting device comprises a carrier having a top surface with a first surface area and a bottom surface with a second surface area; a first conductive via having a top surface with a third surface area and a second conductive via having a top surface with a fourth surface area, wherein the first conductive via and the second conductive via extend from the top surface of the carrier to the bottom surface of the carrier; and a semiconductor structure including a first conductive type semiconductor layer on the top surface, an active layer on the first conductive type semiconductor layer and a second conductive type semiconductor layer on the an active layer, wherein the semiconductor structure overlays on the second conductive via; wherein the sum of the third surface area and the fourth surface area is greater than 40% of the first surface area and smaller than the first surface area.

BRIEF DESCRIPTION OF THE DRAWINGS

The foregoing aspects and many of the attendant advantages of this application will become more readily appreciated as the same becomes better understood by reference to the following detailed description, when taken in conjunction with the accompanying drawings, wherein:

FIGS. 1A-1H illustrate a process flow of forming a light-emitting device in accordance with one embodiment of the present application;

FIGS. 2A-2E illustrate a process flow of forming a light-emitting device in accordance with another embodiment of the present application;

FIGS. 4A-4K illustrate a process flow of forming a light-emitting device in accordance with further another embodiment of the present application.

DETAILED DESCRIPTION OF THE PREFERRED EMBODIMENTS

Figure 3:
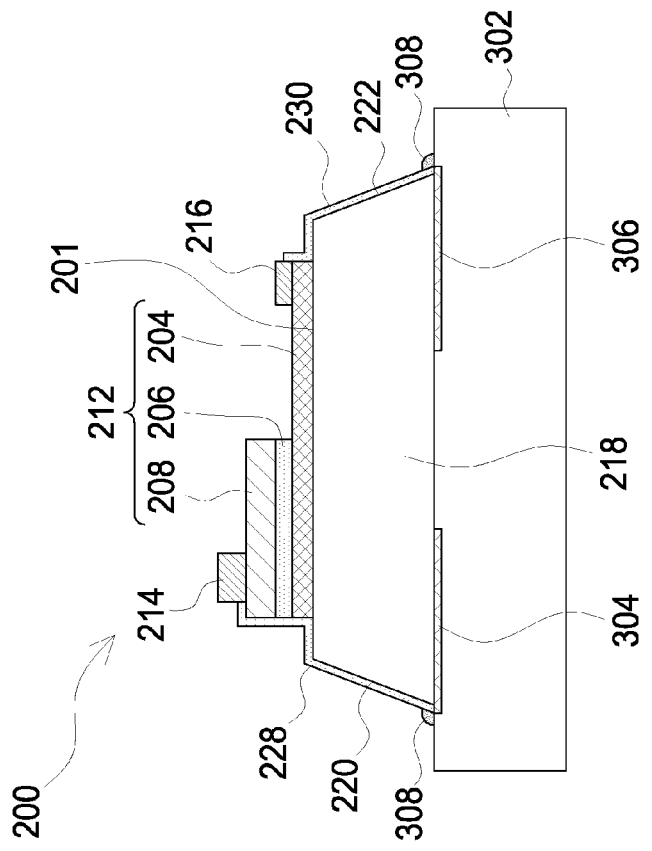
FIG. 3 illustrates a schematic view of forming a surface mounting light-emitting device in accordance with further another embodiment of the present application.

The first embodiment of the present application is illustrated in FIG. 1A to FIG. 1G. Referring to FIG. 1A, a wafer 102 comprising a first surface 104 and a second surface 106 is provided. The wafer is silicon wafer in this embodiment, and it is doped with the impurity of phosphorous or boron for increasing the conductivity. The wafer composition is not restricted in the present invention and can be other compositions or materials with good conductivity. Referring to FIG. 1B, a plurality of through-holes is formed in the wafer 102 by laser. Referring to FIG. 1C, a conductive adhesive layer 117 is formed to combine the semiconductor structure 116 with the wafer 102, then the sapphire substrate (not shown) is removed. The semiconductor structure 116 in this embodiment comprises at least a buffer layer (not shown), a first conductive type semiconductor layer 114, an active layer 112, and a second conductive type semiconductor layer 110. In this embodiment, the first conductive type semiconductor layer 114 is an n-type GaN series material layer, the active layer 112 is a multi-quantum wells structure of III nitride series materials such as InGaN/GaN stacked, the second conductive type semiconductor layer 110 is a p-GaN series material layer. These semiconductor layers are formed on the sapphire substrate by epitaxial process. Referring to FIG. 1D, the semiconductor structure 116 is defined by the lithography and the etching process to form a plurality of patterned semiconductor structures 118. Referring to FIG. 1E, an isolation layer 120 such as silicon oxide or silicon nitride is formed on the sidewall of the patterned semiconductor structure 118, the first surface 104 and the second surface 106 of the wafer 102, and the through-hole 108. The partial regions of the patterned semiconductor structure 118 and the second surface 106 of the wafer 102 are not covered by the insulation layer 120 for electrical connection in later processes.

Referring to FIG. 1F, an electrode 122 is formed on the first conductive type semiconductor layer 114 of the patterned semiconductor structure 118 by the electroplating and the thin film coating process, and a first bonding pad 128 and a second bonding pad 130 are formed on the second surface 106 of the wafer 102. Forming a conductive line 124 through the through-hole 108 to connect electrically the electrode 122 with the first bonding pad 128. The insulation layer 120 insulates the electrode 122, the conductive line 124, and the first bonding pad 128 from the wafer 102. Finally, forming a glue layer 126 such as epoxy to cover the patterned semiconductor structure 118, the conductive line 124, and the electrode 122.

Referring to FIG. 1G, dicing the wafer 102 to form a plurality of substrates 132 for a plurality of surface-mount light-emitting devices. To be succinct, FIG. 1G shows only one surface-mount light-emitting device 100. In this embodiment, the light-emitting device is a vertical type light-emitting device. The first conductive type semiconductor layer 114 of the patterned semiconductor structure 118 connects electrically with the first bonding pad 128 by the electrode 122 and the conductive line 124 which through the through-hole of the substrate 132. The second conductive type semiconductor layer 110 connects electrically with the second bonding pad 130 by the conductive adhesive layer 117 and the conductive substrate 132. FIG. 1H shows the plan view of the FIG. 1G, the area of the patterned semiconductor structure 118 is smaller than that of the substrate 132 in this embodiment, so when the light-emitting device emits the light to the substrate, the light is reflected to the patterned semiconductor structure 118 by the substrate 132 and most of the light is absorbed by the active layer 112. The region of the substrate which is not covered by the patterned semiconductor structure can increase the light extraction efficiency because the reflected light does not pass the active layer 112 and can emit from the substrate 132.

The surface-mount light-emitting device in this embodiment has advantages of a small volume and being suitable for automation manufacturing. It can achieve a reduced package size of the light-emitting device and simpler package process, and satisfy the requirement of being light, thin, short, and small for various electronic products.

FIG. 2A-FIG. 2D described another embodiment of the invention using the WLCSP technique to achieve the light-emitting device package process. First, referring to FIG. 2A, a wafer 202 comprising a first surface 201 and a second surface 203 is provided. The wafer is sapphire wafer in this embodiment. The semiconductor structure 210 in this embodiment comprises at least a buffer layer (not shown), a first conductive type semiconductor layer 204, an active layer 206, and a second conductive type semiconductor layer 208. In this embodiment, the first conductive type semiconductor layer 204 is an n-type GaN series material layer, the active layer 206 is a multi-quantum wells structure of III nitride series materials such as InGaN/GaN stacked, the second conductive type semiconductor layer 208 is a p-GaN series material layer. These semiconductor layers are formed on the sapphire substrate by epitaxial process.

Referring to FIG. 2B, the semiconductor structure 210 is defined by the lithography and the etching process to form a plurality of patterned semiconductor structures 212. Referring to FIG. 2C, the partial region of the semiconductor structure is etched to expose the first conductive type semiconductor layer 204, the second electrode 214 is formed on the second conductive type semiconductor layer 208, and the first electrode 216 is formed on the expose region of the first conductive type semiconductor layer 204.

Figure 2E:
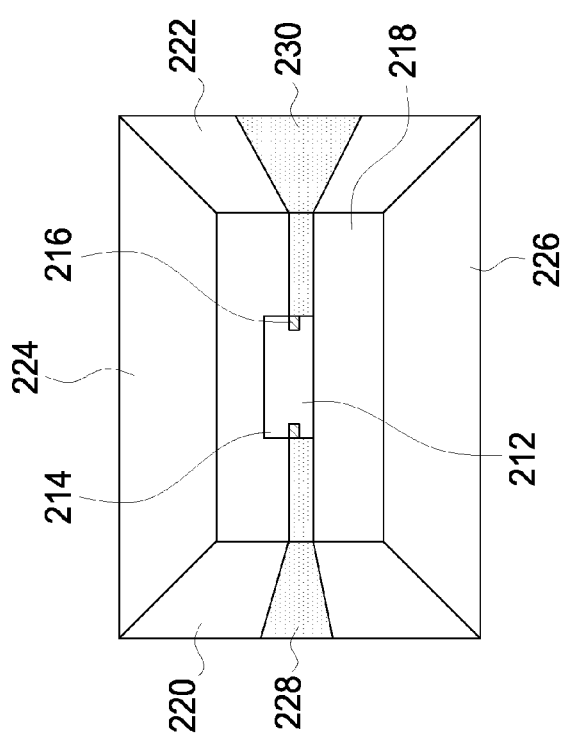

FIG. 2E shows the plan view of FIG. 2D, dicing the wafer 202 to form a plurality of substrates 218 for a plurality of surface-mount light-emitting devices. To be succinct, FIG. 2E shows only one surface-mount light-emitting device 200. The substrate 218 is diced by laser to form a first tilted sidewall 220, a second tilted sidewall 222, a third tilted sidewall 224 and a fourth tilted sidewall 226 for increasing the light extraction efficiency. A preferred range of the angle between the tilted sidewalls 220, 222, 224, 226 and the first surface 201 or the second surface 203 of the substrate 218 is 15-75 degrees in this embodiment. A second bonding pad 232 and a first bonding pad 234 are formed on the second surface 203 of the substrate 218. A second conductive line 228 is formed on the first tilted sidewall 220 and the first surface 201 of the substrate 218. A first conductive line 230 is formed on the second tilted sidewall 222 and the first surface 201 of the substrate 218. A second electrode 214 connects electrically with the second bonding pad 232 through the second conductive line 228. A first electrode 216 connects electrically with the first bonding pad 234 through the first conductive line 230. The light-emitting device is horizontal type in this embodiment with the second electrode 214 and the first electrode 216 located on the same side of the substrate 218.

Referring to FIG. 2E, the area of the patterned semiconductor structure 212 is smaller than the substrate 218 in this embodiment, so when the light-emitting device emits the light to the substrate, the light is reflected to the patterned semiconductor structure by the bonding pad below the substrate and most of the light is absorbed by the active layer 206. The region of the substrate which is not covered by the patterned semiconductor structure 212 can increase the light extraction efficiency because the reflected light does not pass the active layer 206 and can emit from the substrate 218.

FIG. 3 illustrates a schematic view of a surface mounting light-emitting device in accordance with further another embodiment of the present application. The difference between this embodiment and the light-emitting device shown in FIG. 2D is that the first bonding pad and the second bonding pad are omitted in this embodiment. To be convenient, the symbols in this embodiment are the same as the above embodiment. As shown in FIG. 3, a light-emitting device substrate 218 contacts directly with a circuit board 302, the fourth bonding pad 304 and the third bonding pad 306 of the circuit board 302. Because of the tilted sidewall in this embodiment, the solder 308 can climb to the first tilted sidewall 220 and the second tilted sidewall 222, so that the fourth bonding pad 304 and the third bonding pad 306 can connect electrically respectively with the second conductive line 228 and the first conductive line 230 of the surface mount light-emitting device 300 by the solder 308. It can provide strength enough to bond the light-emitting device 300 and the circuit board 302 by using the solder 308 climbing the first tilted sidewall 220 and the second tilted sidewall 222.

FIG. 4A-FIG. 4K describe another embodiment of the application using the WLCSP technique to achieve the light-emitting device package process. First, referring to FIG. 4A, a growth substrate 402 comprising a first surface 401 and a second surface 403 is provided. The growth substrate 402 is sapphire or GaAs in this embodiment. A semiconductor structure 410 is formed on the growth substrate 402. The semiconductor structure 410 comprises a buffer layer (not shown), a first conductive type semiconductor layer 404, an active layer 406, and a second conductive type semiconductor layer 408.

In this embodiment, the first conductive type semiconductor layer 404 is an n-type GaN series material layer or an n-type AlInGaP series material layer, the active layer 206 is a multi-quantum wells structure of III nitride series materials such as InGaN/GaN stacked or a multi-quantum wells structure of III phosphide series materials such as AlInGaP/AlGaP stacked, the second conductive type semiconductor layer 208 is a p-GaN series material layer or a p-AlInGaP series material layer. The semiconductor structure 410 is formed by epitaxial process.

Figure 4A:
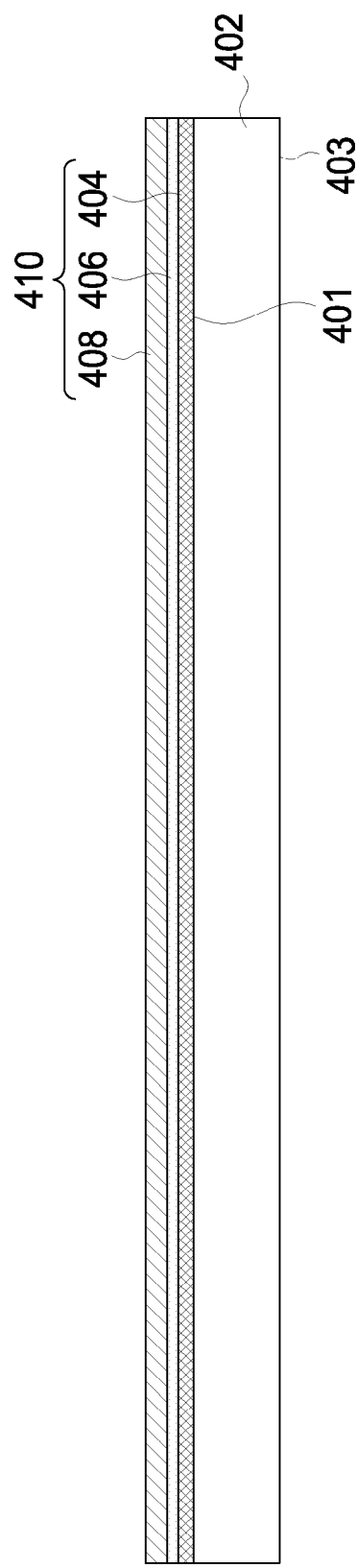
Figure 4B:
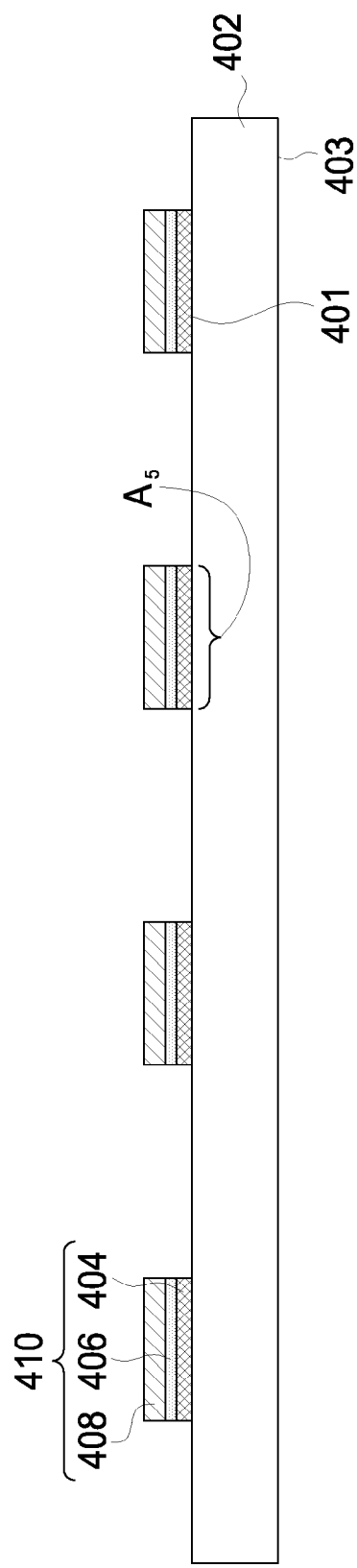
Figure 4C:
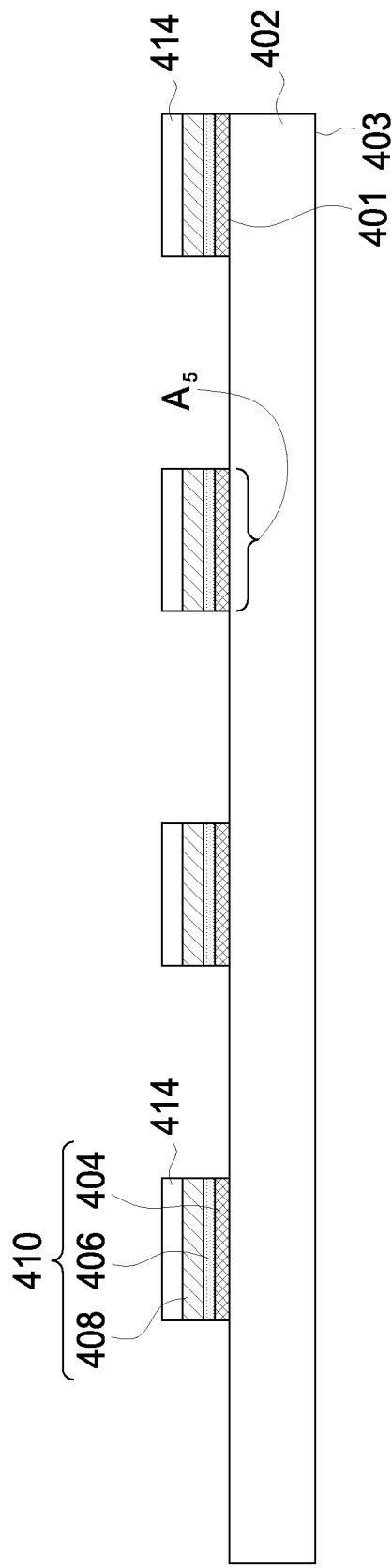

Referring to FIG. 4B, the semiconductor structure 410 is defined by the lithography and the etching process to etch partial region of the semiconductor structure 410 and form a plurality of semiconductor structures 410. The active layer 406 of the semiconductor structure 410 has a fifth surface area ($A_5$) in this figure. Referring to FIG. 4C, for each semiconductor structure 410, a conductive adhesive layer 414 is formed on the second conductive type semiconductor layer 408.

Figure 4D:
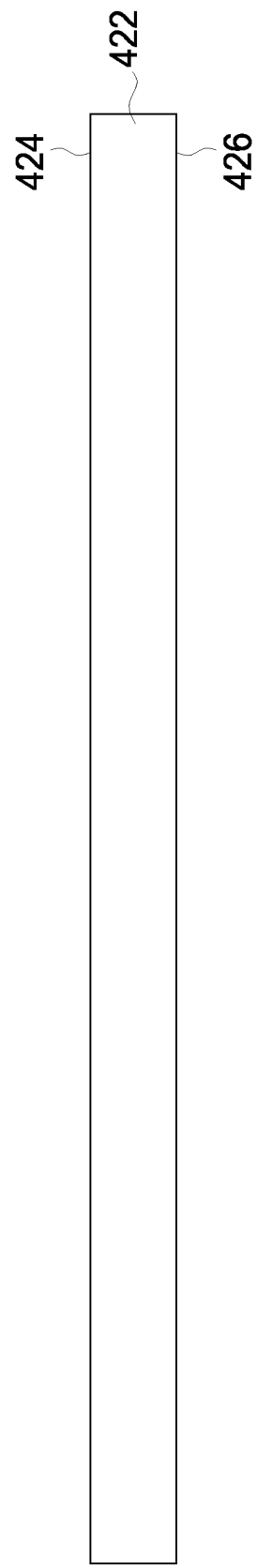
Figure 4E:
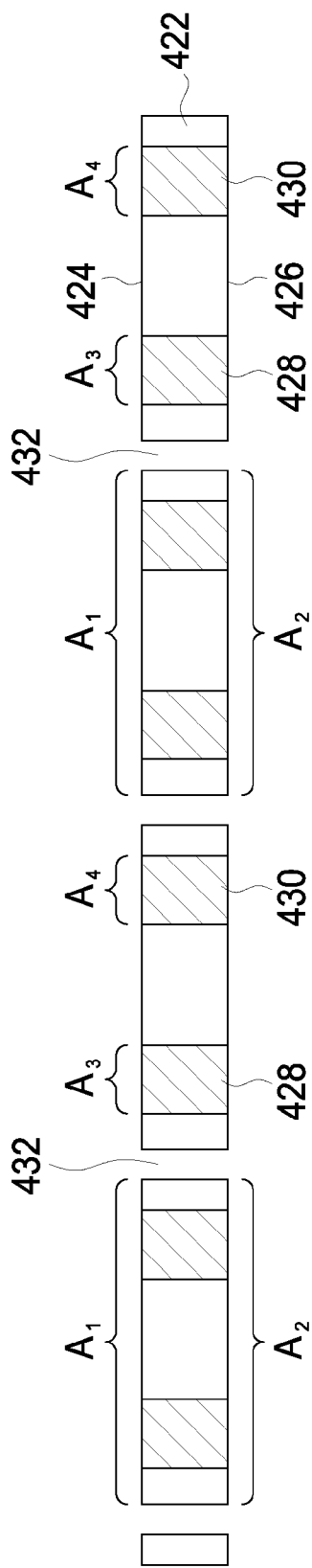
Figure 4F:
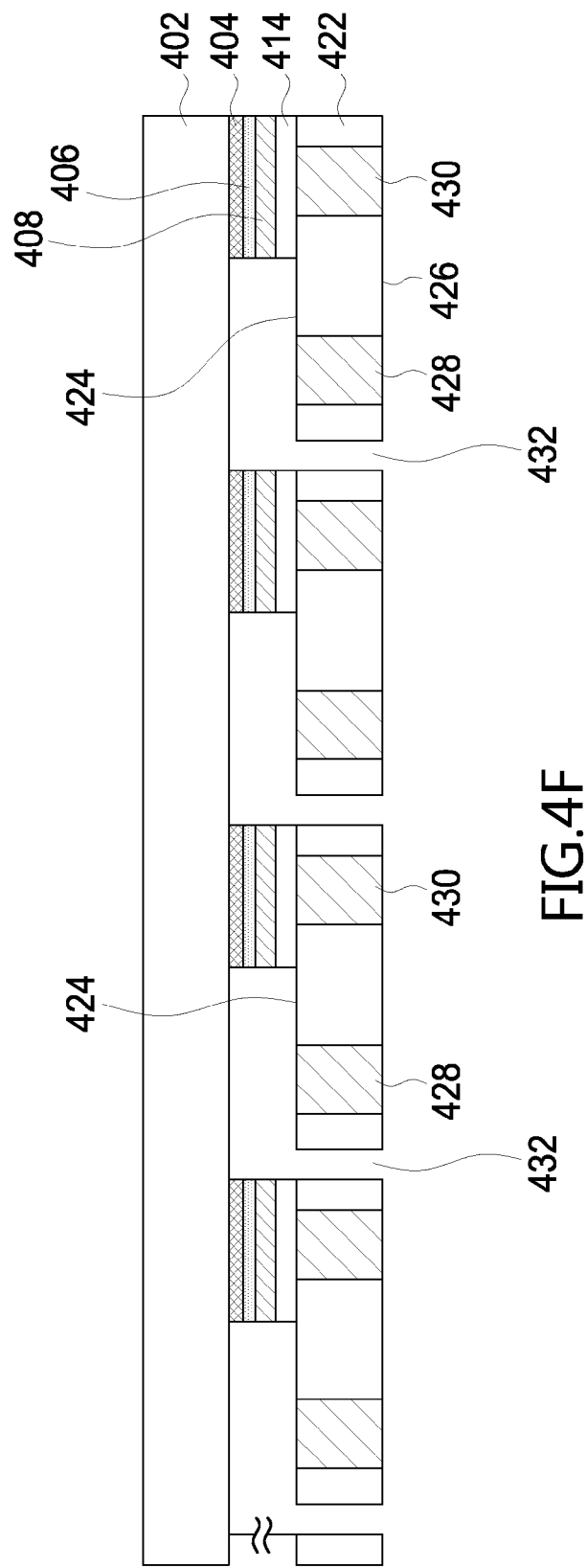

Referring to FIG. 4D, a carrier 422 comprising a top surface 424 and a bottom surface 426 is provided. The carrier 422 is non-conductive and is made of flexible material. The flexible material comprises a heat-resistant resin, such as polyimide or liquid crystal polymer. The carrier 422 has a thickness smaller than 200 μm. Referring to FIG. 4E, a plurality of through-holes is formed in the carrier 422 by laser or etching. Some of the through-holes are filled with an electrical conductive material to form a first conductive via 428 and a second conductive via 430. The other through-holes 432 are not filled with an electrical conductive material. Every two carriers 422 are separated by an un-filled through-hole 432 and each carrier 422 has the top surface with a first surface area ($A_1$) and a bottom surface with a second surface area ($A_2$). In this embodiment, the first surface area ($A_1$) is substantially the same as the second surface area ($A_2$). In the other embodiment, the first surface area ($A_1$) is smaller or larger than the second surface area ($A_2$). The first conductive via 428 has a top surface with a third surface area ($A_3$) and the second conductive via 430 has a top surface with a fourth surface area ($A_4$). The first conductive via 428 and the second conductive via 430 extend from the top surface 424 of the carrier 422 to the bottom surface 426 of the carrier 422. The top surface of the first conductive via 428, the top surface of the second conductive via 430, and the top surface 424 of the carrier 422 are substantially coplanar. In this embodiment, the third surface area ($A_3$) is substantially the same as the fourth surface area ($A_4$). In the other embodiment, the third surface area ($A_3$) is smaller than the fourth surface area ($A_4$). The sum of the third surface area ($A_3$) and the fourth surface area ($A_4$) is greater than 40% of the first surface area ($A_1$) and smaller than the first surface area ($A_1$). The fifth surface area ($A_5$) of the active layer 406 is greater than 30% of the first surface area ($A_1$) and smaller than the first surface area ($A_1$). Referring to FIG. 4F, the conductive adhesive layer 414 combines the semiconductor structure 410 with the carrier 422, then the growth substrate 402 is removed, as shown in FIG. 4G. The semiconductor structure 410 overlays on the second conductive via 430. The second conductive type semiconductor layer 408 of the semiconductor structure 410 connects electrically with the second conductive via 430.

Referring to FIG. 4H, an electrode 436 is formed on the first conductive type semiconductor layer 404, then an insulation structure 434 is formed on a sidewall of the semiconductor structure 410 and on the top surface 424 of the carrier 422. The insulation structure 434 comprises silicon nitride or silicon oxide. Referring to FIG. 4I, a conductive line 435 is formed on the electrode 436 and on the insulation structure 434. The conductive line 435 connects electrically the first conductive via 428 to the first conductive type semiconductor layer 404 by the electrode 436. In other words, the insulation structure 434 is between the sidewall of the semiconductor structure 410 and the conductive line 435.

Referring to FIG. 4J, a protection layer 438 is formed on the conductive line 435 and the semiconductor structure 410 and the carrier 422 is then diced along the through-holes 432 to form a light-emitting device 400. In this embodiment, the first conductive via 428 and the second conductive via 430 are bonding pads for being bonded to metal bumps, so a wafer level chip scale package (WLCSP) is provided.

In another embodiment, referring to FIG. 4K, the carrier 422 is diced by laser to form a tilted sidewall, so the tilted sidewall forms an angle θ between 15 degrees and 75 degrees with the bottom surface 426 of the carrier 422. The first surface area $A_1$ of the carrier 422 is smaller than the second surface area $A_2$ of the carrier 422 in this embodiment. When the semiconductor structure 410 emits the light to the carrier 422, the light is reflected to the semiconductor structure 410 by the first conductive via 428 and the second conductive via 430 of the carrier 422 and most of the light is absorbed by the active layer 406. The region of the carrier 422 which is not covered by the semiconductor structure 410 can increase the light extraction efficiency because the reflected light does not pass the active layer 406 and can be emitted from the carrier 422.

The advantages of the above embodiment of the light-emitting device are that it can achieve a reduced package size, and simpler package process by the WLCSP technique. The reduced area of the light epitaxial layer can increase the light extraction efficiency.

Although specific embodiments have been illustrated and described, it will be apparent that various modifications may fall within the scope of the appended claims.

We claim:

1. A light-emitting device, comprising:
   a carrier having a top surface with a first surface area and a bottom surface with a second surface area;
   a first conductive via having a top surface with a third surface area and a second conductive via having a top surface with a fourth surface area, wherein the first conductive via and the second conductive via each has only one through-hole extending from the top surface of the carrier to the bottom surface of the carrier; and
   a semiconductor structure including a first conductive type semiconductor layer on the top surface of the carrier, an active layer on the first conductive type semiconductor layer and a second conductive type semiconductor layer on the active layer, wherein the semiconductor structure overlays the second conductive via;
   wherein the sum of the third surface area and the fourth surface area is greater than 40% of the first surface area and smaller than the first surface area.

2. The light-emitting device according to claim 1, further comprising a conductive adhesive layer between the carrier and the semiconductor structure.

3. The light-emitting device according to claim 1, wherein the second conductive type semiconductor layer connects electrically with the second conductive via.

4. The light-emitting device according to claim 1, wherein the top surface of the first conductive via, the top surface of the second conductive via, and the top surface of the carrier are substantially coplanar.

5. The light-emitting device according to claim 1, wherein the first surface area is substantially the same as or smaller than the second surface area.

6. The light-emitting device according to claim 1, wherein the first surface area is larger than the second surface area.

7. The light-emitting device according to claim 1, wherein the third surface area is substantially the same as or smaller than the fourth surface area.

8. The light-emitting device according to claim 1, wherein the carrier further comprising a tilted sidewall.

9. The light-emitting device according to claim 8, wherein the tilted sidewall forms an angle between 15 degree and 75 degree with the bottom surface of the carrier, wherein the bottom surface is farther from the semiconductor structure than the top surface.

10. The light-emitting device according to claim 1, wherein the active layer of the semiconductor structure has a fifth surface area greater than 30% of the first surface area and smaller than the first surface area.

11. The light-emitting device according to claim 1, wherein the carrier is non-conductive.

12. The light-emitting device according to claim 1, wherein the semiconductor structure comprises III-nitride material or III-phosphide material.

13. The light-emitting device according to claim 1, wherein the first conductive via and the second conductive via are bonding pads for being bonded to metal bumps.

14. The light-emitting device according to claim 1, further comprising a conductive line formed on a sidewall of the semiconductor structure and electrically connecting the first conductive via to the first conductive type semiconductor layer.

15. The light-emitting device according to claim 1, further comprising an insulation structure between a sidewall of the semiconductor structure and the conductive line.

16. The light-emitting device according to claim 1, wherein the carrier has a thickness smaller than 200 μm.

17. The light-emitting device according to claim 1, wherein the carrier is made of flexible material.

18. The light-emitting device according to claim 14, further comprising a protection layer on the conductive line and the semiconductor structure.

19. The light-emitting device according to claim 1, wherein the first conductive via and the second conductive via are capable of reflecting a light emitted from the semiconductor structure.

20. The light-emitting device according to claim 1, wherein the semiconductor structure does not overlay the first conductive via.

* * * * *